United States Patent [19]

Altman et al.

[11] 3,715,250

[45] Feb. 6, 1973

[54] ALUMINUM ETCHING SOLUTION

[75] Inventors: Leonard F. Altman, Philadelphia; Marcus Sharp, Lansdale, both of Pa.

[73] Assignee: General Instrument Corporation, Newark, N.J.

[22] Filed: March 29, 1971

[21] Appl. No.: 128,896

[52] U.S. Cl. .................................... 156/22, 252/79.4

[51] Int. Cl. ............................................... C23g 1/22

[58] Field of Search ............ 156/21, 22, 14; 252/79.4

[56] References Cited

UNITED STATES PATENTS 3,119,726 1/1964 King et al. ............................. 156/19
3,325,410 6/1967 Crotty .................................. 252/87
3,448,055 6/1969 Mickelson et al. ................. 252/79.3

FOREIGN PATENTS OR APPLICATIONS 571,705 3/1959 Canada ................................ 156/21

*Primary Examiner*—J. Steinberg
*Attorney*—James & Franklin

[57] ABSTRACT

An etching bath, useful in the fabrication of hybrid thin film and silicon monolithic semiconductor devices, for removing aluminum film which is unprotected by an overlying photoresist. The bath includes the conventional combination of phosphoric, nitric, and acetic acids, to which is added about 2¼ grams of sucrose per 100 ml of etch solution. Addition of the sucrose substantially reduces undercutting and improves resistance to over-etching.

7 Claims, 3 Drawing Figures

INVENTORS
LEONARD F. ALTMAN
MARCUS SHARP
BY Gail W. Woodward
AGENT

ALUMINUM ETCHING SOLUTION

BACKGROUND OF THE INVENTION

Monolithic semiconductor microcircuits typically employ a silicon wafer which contains active and passive circuit elements usually produced by a combination of vapor phase diffusion and epitaxial crystal growth, with the genetic oxide acting as a surface passivation layer. An overlying layer of aluminum is photolithographically contoured to act as a metal contact to the silicon and to provide conductive interconnections for the various device elements. This photolithographic process is as follows: After the microcircuit, in wafer form, is processed to the point of metallization, a layer of aluminum is deposited over the entire wafer using, for example, electron beam vacuum evaporation. The aluminum is then covered with a layer of photoresist which is exposed to a pattern of light and then developed to lay bare those areas of aluminum that are to be removed. An aluminum etchant is applied for a period of time to cause all of the exposed aluminum to be removed but not long enough to cause the etchant to penetrate under the photoresist pattern.

It has been known that alkali metal ions can penetrate silicon dioxide and migrate freely through the oxide even at relatively low temperatures under the influence of relatively low electric field values. These alkali metal ions in the oxide can influence the conductivity of the silicon in such a way as adversely to alter the operation of the circuit elements established therein. One possible source of alkali metal ion contamination of the oxide is the etchant used in the photolithographic process to remove the excess aluminum. In order to avoid the introduction of alkali metal ions at this stage of fabrication, the usual caustic aluminum etchants must be avoided. A widely used etchant free of alkali metal ions comprises a mixture of phosphoric, nitric, and acetic acids. When this etchant is employed in the 55° to 90° C temperature range, the aluminum is removed rapidly and effectively from the microcircuit wafer. This etchant does not attack the silicon dioxide, and the conventional photoresists employed in the microelectronic industry are adequate to provide the desired localization.

The speed of this etching solution also makes it useful in the photolithographic removal of aluminum films from hybrid microelectronic devices where relatively thick films are employed. Aluminum lines several mils wide and up to about a mil thick may be used as the interconnecting conducting medium deposited upon a ceramic substrate. This is approximately 10 times the thickness of films used in monolithic devices.

This conventional etch has two drawbacks. It tends to undercut the resist which causes tapering of the edges of the aluminum metal, thereby reducing the cross section of the conductors. In addition, if etching is continued after the metal has been removed in exposed areas, the metal edges under the resist continue to be attacked and conductor linewidth continues to be reduced. Thus, overetching produces linewidth reduction that, in the case of fine line devices, can be serious.

On the other hand it is well known that variations in metal thickness across a substrate naturally occur in the deposition process. If a substrate is only etched long enough to remove the metal in the regions where it is thinnest, it will not be completely removed in those regions where it is thickest. When the etching is continued until the metal removal is complete in the regions of thickest metal, overetching can occur in the regions of thinnest metal. Desirably the etchant should rapidly remove the exposed aluminum but it should not penetrate under the photoresist and the sensitivity to overetching should be kept low.

SUMMARY OF THE INVENTION

It is an object of the present invention to provide an etchant free of alkali metal ions and that will rapidly attack resist-delineated aluminum while reducing undercutting of the resist.

It is a further object to provide an etchant that will remove aluminum in a resist-delineated system while minimizing sensitivity to overetching.

These and other objects are accomplished in the present invention by the addition of sucrose to the prior art etchant comprising phosphoric, nitric, and acetic acids. The sucrose in either powder or solution form is added in small increments to the etch solution while hot until the etch solution turns black.

DESCRIPTION OF THE PREFERRED PRACTICE OF THE INVENTION

Figure 1:
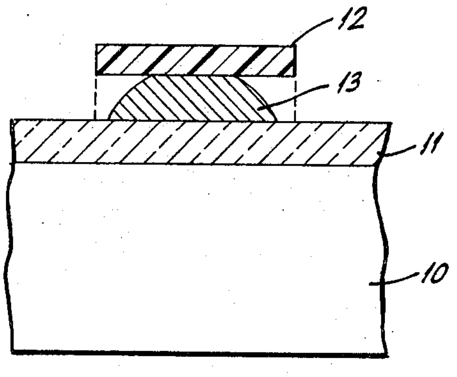
FIG. 1. (PRIOR ART)
FIG. 1 is a section of a microcircuit showing a metal line after etching in the prior art solution.

In FIG. 1, a silicon wafer 10 having a surface oxide 11 contains one or more microelectronic devices (not shown) and is to be provided with an aluminum interconnection pattern. (It should be noted that in the interest of clarity the drawings are not to scale. The vertical scale is greatly exaggerated.) First the entire wafer is coated with a layer or film of aluminum typically about 1 or 2 microns thick and a layer of photoresist is applied over the aluminum. After the photoresist has been exposed and developed and the aluminum etched in a conventional prior art solution to the point of removal of all aluminum not protected by the resist, the cross section of a typical metal line 13 under the photoresist 12 will be as shown in FIG. 1. Ideally the metal line would be of the same width as the photoresist as indicated by the dotted lines.

The results of FIG. 1 are obtained using an etching bath composed of about 80 volume percent of concentrated (85 percent) phosphoric acid, about 5 volume percent of concentrated (70 percent) nitric acid, about 5 volume percent of glacial (100 percent) acetic acid, and about 10 volume percent water. An anionic fluorocarbon surfactant (such as FC–95 currently manufactured by 3M Co.) in the amount of about 0.15 g per liter of solution is added to improve etching and to facilitate solution removal during rinsing. The solution is operated in the range of 55° to 90° C. Higher temperatures make the etching too rapid while too low a temperature renders the attack spotty.

Figure 2:
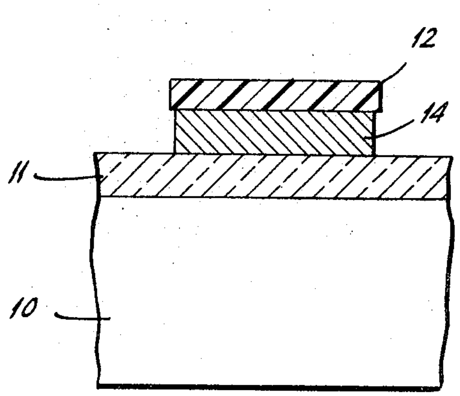
FIG. 2 is a section of a microcircuit showing metal line after etching in the improved solution.

The results of FIG. 2 were obtained when about 22.5 grams of sucrose were added to 1 liter of the above solution. It is best to add the sucrose while the solution is heated to over 90° C. The elevated temperature is required to react the sucrose with the other bath components. While the desired reaction will occur at 70° C, the reaction is slow and mixing time is extended. At 90° C the reaction is quite rapid. Small quantities of sucrose are added while stirring and the resulting chemical activity allowed to subside before the next increment is added. As more sucrose is added, the solution darkens. If the recommended 22.5 grams per liter is substantially exceeded, a precipitate forms. If substantially less sucrose is employed, the results as shown in FIG. 2 degrade and solution performance reverts toward the results shown in FIG. 1.

It can be seen that the metal layer 14 of FIG. 2 more closely approaches the ideal situation. There is greatly reduced undercutting and loss of line width. This becomes of great importance in devices having line widths of less than 0.5 ml. State of the art devices now employ 0.25 mil lines, and line width values as low as 0.1 mil are contemplated. For a 0.1 mil line, the width is only a little greater than twice the thickness of a 1 micron metal layer. Using the prior art etch on such a line would often result in complete undercutting, an unacceptable condition.

Figure 3:
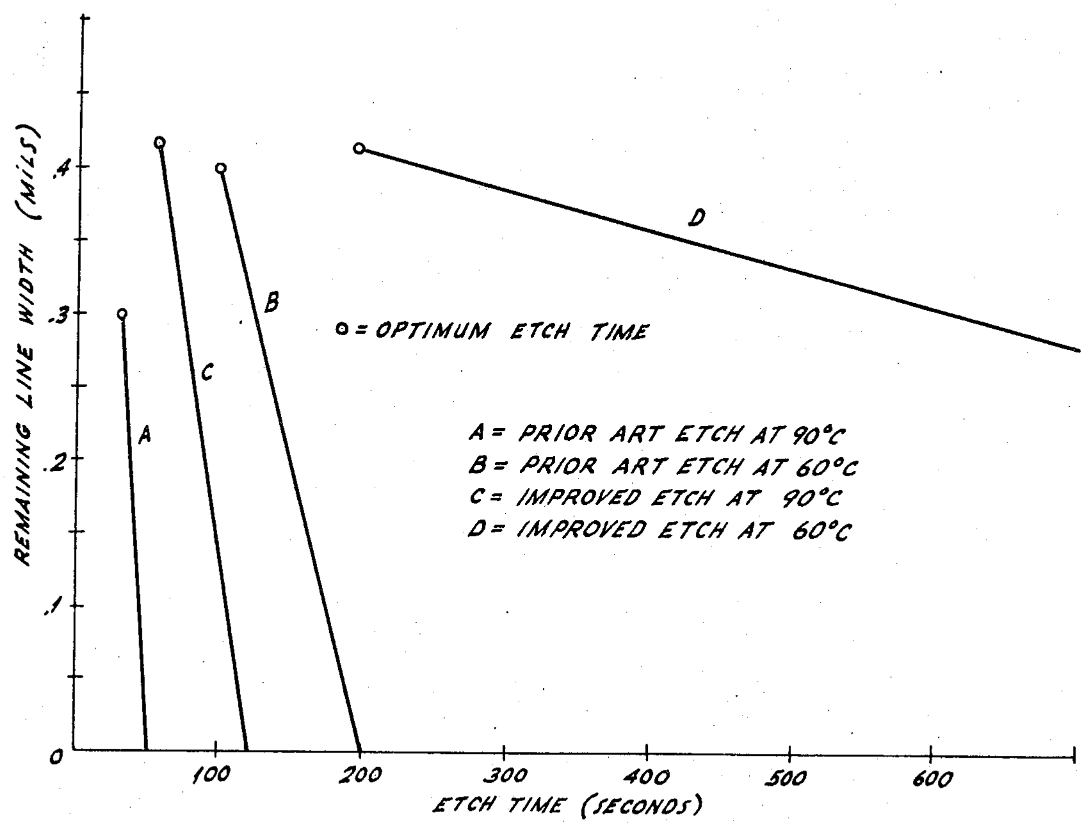
FIG. 3 is a graph depicting the etching performance of the prior art and improved etchants at two temperature extremes.

FIG. 3 is a graph comparing performance of the prior art etch with that of the improved etch of this invention. The metal thickness was 2 microns and the initial photoresist lines were made 0.54 mil wide. The circles at the head of each line show the time and remaining average line width coordinates of optimum etch time. Optimum etch time is realized when all of the metal has been completely removed from areas on the wafers not covered by photoresist. Curve A shows the prior art solution operated at 90° C and curve B is the same solution at 60° C. Curves C and D show the improved etch at 90° C and 60° C respectively.

At optimum etch time the improved etch shows less loss of line width at 90° C than the prior art etch at either 60° or 90° C. At 90° C the improved etch requires almost 2 ½ times as long in the etch to go to zero line width. At 60° C the tolerance of the improved etch to over etching is dramatic and the undercutting is minimized.

The following chart contains data derived from FIG. 3. It shows line width loss per unit time for the four curves.

| Solution | Temperature (degrees C) | FIG. 3 Curve | Line Width Loss (micro inches/second) |
|---|---|---|---|
| prior art | 90 | A | 15.2 |
| prior art | 60 | B | 4.0 |
| improved | 90 | C | 6.7 |
| improved | 60 | D | 0.3 |

The following examples illustrate further aspects of this invention:

EXAMPLE 1

Oxidized silicon wafers were cleaned, coated with vacuum deposited high purity aluminum to a thickness of 1 micron, and photoresist processed to produce 0.1 mil lines. Etching was done at 60° using the following composition by approximate volume: 80 percent concentrated phosphoric acid, 5 percent concentrated nitric acid, 5 percent glacial acetic acid, 10 percent water, and about 1.5 grams anionic fluorocarbon surfactant per liter of solution. The wafers were etched for the minimum time required to completely removed the exposed aluminum. Etching occurred at 7,500A/min rate and undercut the resist by 30 to 40 microinches. After etching the wafers were rinsed in deionized water and dried. Measurements were made using a microscope with a calibrated filar eyepiece. Performance, using this prior art etch, was arbitrarily rated fair.

EXAMPLE 2

The conditions of Example 1 were followed but about 22.5 grams of powdered sucrose was added to 1 liter of the etch as described above while the bath was heated to 90° C. The etch rate at 60° C was 2,800A/min and the resist was undercut by only 10–20 microinches. Performance was rated as very good.

EXAMPLE 3

The conditions of Example 1 were followed but sucrose was added to the solution first mixing it with the water and then adding the sucrose solution to the acids of the prior art etch at 90° C. The etch rate at 60° C was 2,500A/min and the resist was undercut by only 10–20 microinches. Performance was rated as very good.

EXAMPLE 4

The conditions of Example 2 were followed but the surfactant was omitted. The solution viscosity was high and rinsing was difficult. The etch rate was 2,800A/min but the resist was undercut 40 to 60 microinches. Performance was rated very poor.

EXAMPLE 5

The conditions of Example 2 were followed except that the nitric acid was added after all other ingredients were mixed. The final solution was very light and the viscosity low. The etch rate was 2,000A/min and the resist was undercut by 20–40 microinches. Performance was rated poor.

EXAMPLE 6

Oxidized silicon wafers were cleaned and vacuum coated with 2 microns of high purity aluminum. Photoresist was applied and processed to produce 0.5 mil lines. (The nominal linewidth was 0.54 mil.) After etching until all of the exposed aluminum was just barely removed, the wafers were rinsed in deionized water. The optimum etch time was noted and measurements of linewidth were made with a 600X microscope using a calibrated filar eyepiece. The wafers were then overetched and measured at successive time periods. This procedure was followed for both the prior art etch and the improved etch of the invention at 60° C and 90° C. The results were tabulated to produce FIG. 3.

EXAMPLE 7

Using the conditions of Example 6 the effect of acetic acid concentration was investigated. It was determined that at least 10 percent variation could be tolerated.

EXAMPLE 8

Using the conditions of Example 6 the effect of nitric acid concentration was investigated. It was determined that at least 5 percent variation could be tolerated.

We claim:

1. An etching bath for the removal of aluminum in the presence of a photoresist, said bath comprising about 80 volume percent of concentrated phosphoric acid, about 5 volume percent concentrated nitric acid, about 5 volume percent of glacial acetic acid, about 10 volume percent water, and about 22.5 grams of sucrose per liter of solution.

2. An etching bath for the removal of aluminum in the presence of a photoresist, said bath comprising about 80 volume percent of 85 percent phosphoric acid, about 5 volume percent of 70 percent nitric acid, about 5 volume percent of glacial acetic acid, about 10 volume percent water, about 0.15 gram per liter of solution of an anionic fluorocarbon surfactant, and about 22.5 grams of sucrose per liter of solution.

3. The bath of claim 2 where said sucrose is added to the other components of said bath at about 90° C.

4. The method of etching an aluminum film on a substrate surface in the presence of a photoresist which method comprises immersing the substrate in a solution having as essential ingredients about 80 volume percent concentrated phosphoric acid, about 5 volume percent concentrated nitric acid, about 5 volume percent glacial acetic acid, about 10 volume percent water, and about 22.5 grams sucrose per liter of solution, the solution being operated in the range of about 55° C to about 90° C, maintaining immersion for a period of time sufficient to remove the aluminum not covered by said photoresist, and rinsing the solution from the substrate, whereby undercutting of the photoresist and linewidth reduction are minimized.

5. In the method of etching an aluminum film on a substrate surface in the presence of a photoresist which comprises immersing the substrate in a solution having as essential ingredients about 80 volume percent concentrated phosphoric acid, about 5 volume percent concentrated nitric acid, about 5 volume percent glacial acetic acid, about 10 volume percent water, and about 0.15 gram anionic fluorocarbon surfactant per liter of solution, maintaining the solution at a temperature in the range of 55° to 90°C, maintaining immersion for a period of time sufficient to remove the aluminum not covered by the photoresist, and rinsing the solution from the substrate, the improvement comprising adding about 2 ¼ grams sucrose per 100 ml of solution whereby undercutting of the photoresist and linewidth reduction are minimized.

6. The improvement of claim 5 wherein the sucrose is added in powder form in small increments while the bath is maintained at about 90° C.

7. The improvement of claim 5 wherein the sucrose is first dissolved in the water and the sucrose solution added in small increments to the remainder of the solution components at about 90° C.

* * * * *